United States Patent
Jiang et al.

(10) Patent No.: US 10,665,818 B2
(45) Date of Patent: May 26, 2020

(54) ENCAPSULATION STRUCTURE, METHOD FOR PRODUCING THE SAME, AND DISPLAY APPARATUS

(71) Applicant: BOE Technology Group Co., Ltd., Beijing (CN)

(72) Inventors: Bo Jiang, Beijing (CN); Wei Xu, Beijing (CN); Wei Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/958,096

(22) Filed: Apr. 20, 2018

(65) Prior Publication Data
US 2019/0067639 A1    Feb. 28, 2019

(30) Foreign Application Priority Data
Aug. 25, 2017    (CN) .......................... 2017 1 0743597

(51) Int. Cl.
*H01L 51/52* (2006.01)
*H01L 51/44* (2006.01)
*H01L 51/00* (2006.01)

(52) U.S. Cl.
CPC ...... *H01L 51/5256* (2013.01); *H01L 51/0097* (2013.01); *H01L 51/448* (2013.01);
(Continued)

(58) Field of Classification Search
CPC ............. H01L 51/5256; H01L 51/0097; H01L 2251/5338; H01L 2251/5369; H01L 51/5259; H01L 51/56
(Continued)

(56) References Cited

U.S. PATENT DOCUMENTS

| 2005/0051763 A1* | 3/2005 | Affinito et al. ..... H01L 51/5256 |
|---|---|---|
| | | 257/3 |
| 2006/0083694 A1* | 4/2006 | Kodas et al. ............ C08J 3/203 |
| | | 424/46 |

(Continued)

FOREIGN PATENT DOCUMENTS

| CN | 101320785 A | 12/2008 |
|---|---|---|
| CN | 102593371 A | 7/2012 |

(Continued)

OTHER PUBLICATIONS

First Office Action, including Search Report, for Chinese Patent Application No. 201710743597.2, dated Sep. 20, 2018, 11 pages.
(Continued)

*Primary Examiner* — Thinh T Nguyen
(74) *Attorney, Agent, or Firm* — Westman, Champlin & Koehler, P.A.

(57) ABSTRACT

Provided are an encapsulation structure, a method for producing the same, and a display apparatus. The encapsulation structure comprising a plurality of layers covering the outside of a device to be encapsulated, wherein the plurality of layers comprises an inorganic layer and an organic layer, which are stacked alternatively, wherein the organic layer comprises an organic layer matrix and hydrophobic particles, and wherein the hydrophobic particle comprises an inorganic nanoparticle and a hydrophobic group.

19 Claims, 4 Drawing Sheets

(52) U.S. Cl.
    CPC .. *H01L 51/5212* (2013.01); *H01L 2251/5338* (2013.01); *H01L 2251/5369* (2013.01)

(58) Field of Classification Search
    USPC .................. 257/40, 72, 79; 438/82, 99, 48
    See application file for complete search history.

(56) References Cited

U.S. PATENT DOCUMENTS

| | | | |
|---|---|---|---|
| 2008/0305360 A1 | 12/2008 | Han et al. | |
| 2012/0146492 A1* | 6/2012 | Ryu et al. | H01J 1/70 313/512 |
| 2012/0199872 A1 | 8/2012 | Chen et al. | |
| 2015/0314941 A1* | 11/2015 | Ramadas et al. | B65D 1/264 361/679.01 |
| 2017/0133634 A1* | 5/2017 | Park et al. | H01L 51/5268 |
| 2017/0358775 A1* | 12/2017 | Jain et al. | H01L 51/5256 |
| 2018/0166653 A1 | 6/2018 | Xie et al. | |
| 2018/0287097 A1* | 10/2018 | Ni et al. | H01L 51/5259 |
| 2019/0031810 A1* | 1/2019 | Bockstaller et al. | C08K 3/22 |

FOREIGN PATENT DOCUMENTS

| | | |
|---|---|---|
| CN | 102639642 A | 8/2012 |
| CN | 103348502 A | 10/2013 |
| CN | 106816549 A | 6/2017 |
| CN | 106960916 A | 7/2017 |
| EP | 2 505 613 A1 | 10/2012 |

OTHER PUBLICATIONS

Second Office Action, including Search Report, for Chinese Patent Application No. 201710743597.2, dated Apr. 16, 2019, 21 pages.
Third Office Action, including Search Report, for Chinese Patent Application No. 201710743597.2, dated Sep. 30, 2019, 19 pages.

* cited by examiner

ENCAPSULATION STRUCTURE, METHOD FOR PRODUCING THE SAME, AND DISPLAY APPARATUS

CROSS REFERENCE OF RELATED APPLICATION

This disclosure claims the priority of Chinese Patent Application No. 201710743597.2 filed on Aug. 25, 2017, which is incorporated herein in its entirety by reference.

TECHNICAL FIELD

This disclosure relates to the field of encapsulation of display devices, in particular, to an encapsulation structure, a method for producing the same, and a display apparatus.

BACKGROUND ART

Organic light-emitting diode (OLED) display apparatuses have advantages, such as self-luminescence, high contrast, low power consumption, wide viewing angle and capability of flexible displaying, which are considered as the new generation of tablet display apparatuses, and are a focus of the study in the display industry. The main display component of an OLED display apparatus is an OLED device. However, the OLED device tends to be attacked by components such as oxygen and moisture and the like in the air, which reduces the life time of the OLED device greatly. Therefore, it is generally needed to encapsulate the OLED device by an encapsulation structure, to isolate the OLED device from components in the air, such as oxygen and moisture and the like, thereby extending the life time of the OLED device.

In the related art, an encapsulation structure comprises an inorganic layer, an organic layer and an inorganic layer, which are stacked sequentially and cover the outside of the OLED device. Among them, the inorganic layers have the ability to block moisture and oxygen, and the main function thereof is to isolate the OLED device from the air in the environment. The organic layer has bendability (or called elasticity), and the main function thereof is to achieve flexible displaying of the OLED device.

SUMMARY

In one aspect, this disclosure provides an encapsulation structure, comprising a plurality of layers covering the outside of a device to be encapsulated, wherein the plurality of layers comprises an inorganic layer and an organic layer, which are stacked alternatively, wherein the organic layer comprises an organic layer matrix and hydrophobic particles, and wherein the hydrophobic particle comprises an inorganic nanoparticle and a hydrophobic group.

Optionally, the hydrophobic particle comprises a core of the inorganic nanoparticle and a shell comprising the hydrophobic group.

Optionally, the hydrophobic group comprises at least one of alkyl, aryl, and arylalkyl.

Optionally, the inorganic nanoparticle includes at least one of a silica particle, a magnesium oxide particle, a magnesium fluoride particle, a titanium oxide particle, a zinc oxide particle, a zinc sulfide particle, an alumina particle, and a zirconia particle.

Optionally, the encapsulation structure further comprises a hydrophobic layer between the inorganic layer and the organic layer, wherein the elasticity of the hydrophobic layer is larger than that of the inorganic layer.

Optionally, the hydrophobic layer is formed of the hydrophobic particles.

Optionally, the hydrophobic particle is formed of a material having a wide band gap, and wherein the transparency of the hydrophobic particle is more than 0.9.

Optionally, the organic layer matrix is formed of a material selected from the group consisting of a UV-curable material and a thermal-curable material.

Optionally, the inorganic layer is formed of at least one material selected from silica, silicon nitride and silicon oxynitride.

In another aspect, this disclosure provides a method for producing the encapsulation structure mentioned above, comprising:

forming an inorganic layer covering a device to be encapsulated on the outside of the device to be encapsulated; and forming an organic layer covering the inorganic layer on the outside of the inorganic layer, wherein the organic layer comprises an organic layer matrix and hydrophobic particles, wherein the hydrophobic particle comprises an inorganic nanoparticle and a hydrophobic group.

Optionally, the hydrophobic particle comprises a core of the inorganic nanoparticle and a shell comprising the hydrophobic group.

Optionally, the hydrophobic group comprises at least one of alkyl, aryl, and arylalkyl.

Optionally, the inorganic nanoparticle includes at least one of a silica particle, a magnesium oxide particle, a magnesium fluoride particle, a titanium oxide particle, a zinc oxide particle, a zinc sulfide particle, an alumina particle, and a zirconia particle.

Optionally, said forming an organic layer covering the inorganic layer on the outside of the inorganic layer comprises:

forming a hydrophobic layer covering the inorganic layer on the outside of the inorganic layer, wherein the elasticity of the hydrophobic layer is larger than that of the inorganic layer; and forming the organic layer on the outside of the hydrophobic layer, to cover the hydrophobic layer.

Optionally, said forming a hydrophobic layer covering the inorganic layer on the outside of the inorganic layer comprises:

forming a hydrophobic layer covering the inorganic layer on the outside of the inorganic layer by an ink jet printing process or a spin coating process by using the hydrophobic particles.

Optionally, said forming an organic layer covering the inorganic layer on the outside of the inorganic layer comprises:

forming a mixture layer of an organic material and hydrophobic particles on the outside of the inorganic layer by an ink jet printing process or a spin coating process; and subjecting the mixture layer to curing treatment, to obtain the organic layer, wherein the organic material comprises any of a UV-curable material and a thermal-curable material.

In still another aspect, this disclosure provides a display apparatus, comprising:

a display device encapsulated by the encapsulation structure mentioned above.

Optionally, the display device is an organic light-emitting diode device or a quantum dot light-emitting diode device.

It should be understood that the summary above and the detailed embodiments below are illustrative, and do not limit this disclosure.

BRIEF DESCRIPTION OF DRAWINGS

In order to describe the technical solutions in examples of this disclosure more clearly, drawings needed to be used in illustration for examples will be described briefly below. Obviously, the drawings in the description below are only some examples of this disclosure. For a person skilled in the art, other drawings may be obtained according to these drawings without inventive labor.

Drawings are incorporated into the description and build a part of the description, show examples complying with this disclosure, and are used together with the description to explain the principle of this disclosure.

DETAILED EMBODIMENTS

This disclosure will be further described in details by incorporating drawings, in order to make the purposes, the technical solutions and the advantages of this disclosure clearer. Obviously, the examples described only a part of examples of this disclosure, but not all examples. On the basis of the examples in this disclosure, all other examples obtained by a person skilled in the art without inventive labor belong to the protection scope of this disclosure.

OLED display apparatuses have advantages, such as self-luminescence, high contrast, rapid response, low power consumption, wide viewing angle, low thickness, being suitable for flexible displaying, which are considered as the new generation of tablet display apparatuses, and are an important trend of development in the display industry now. The OLED display apparatuses include flexible OLED display apparatuses and rigid OLED display apparatuses. The flexible OLED display apparatuses have advantages, such as being light and thin, convenience for taking, low power consumption, long endurance and good durability, and have wide application prospect in large-size TVs, tablet display apparatuses, mobile terminals and wearable equipment.

Figure 1:
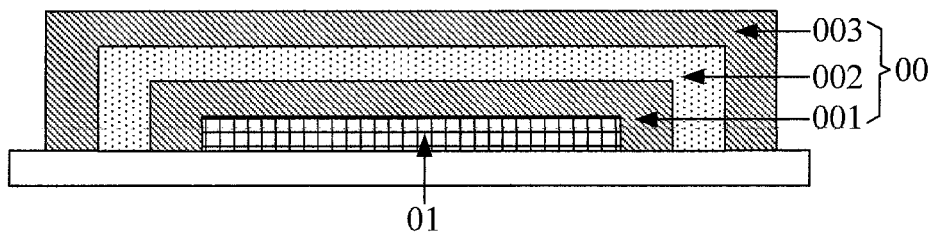
FIG. 1 is a drawing showing the use of an encapsulation structure provided in the related art.

An OLED display apparatus comprises, from bottom to top, a base substrate, an OLED device and an encapsulation structure. The OLED device is very sensitive to components in the air, such as moisture and oxygen and the like. The encapsulation structure may isolate the OLED device from the air in the environment. This results in that the encapsulation structure is particularly important in the OLED display apparatus. The encapsulation structure even determines the life time and environment reliability of the OLED device. Since inorganic materials exhibit good blocking ability against moisture, oxygen, and the like, they are often used to produce the encapsulation structure. However, since the elasticity of an inorganic material is relatively low, the encapsulation structure formed of an inorganic material would have the problem of inner stress concentration. This results in that when used in flexible displaying, the encapsulation structure tends to be broken or peeled off, which causes the failure of the encapsulation. Therefore, when flexible displaying is performed, it is typical to stack an inorganic layer, an organic layer and an inorganic layer sequentially, to form the encapsulation structure. Exemplarily, referring to FIG. 1, it shows the use of an encapsulation structure 00 provided in the related art. Referring to FIG. 1, the encapsulation structure 00 comprises an inorganic layer 001, an organic layer 002 and an inorganic layer 003, which cover on the outside of an OLED device 01 sequentially. The inorganic layer 001 and the inorganic layer 003 are formed of an inorganic material, respectively. The inorganic layer 001 and the inorganic layer 003 have good blocking ability against moisture, oxygen, and the like. The organic layer 002 is formed of an organic material, and has relatively good elasticity. The organic layer 002 may reduce the stress of the inorganic layer 001 and the inorganic layer 003 and decrease the possibility of occurrence of breaking or peeling off in the encapsulation structure 00. However, during production, the some defects would be generated in the inorganic layers. For example, an air channel or the like would occur. Further, the organic layer has relatively poor blocking ability against moisture, oxygen, and the like. Therefore, a small amount of moisture, oxygen, or the like would still pass through the encapsulation structure along the defect passages in the inorganic layers and arrive at the OLED device, so as to influence the life time of the OLED device.

During finishing this disclosure, the inventors find that there is at least the following problem in the related art.

The bendability of the inorganic layers is relatively poor. Hence, during the production of the encapsulation structure, it is unavoidable to form an air channel in the inorganic layers. For example, during the encapsulation structure is bent, an air channel will be formed in the inorganic layers. This results in that it is hard to encapsulate the OLED device effectively. Therefore, the encapsulation effect of the encapsulation structure is relatively poor.

In the encapsulation structure, the method for producing the same, and the display apparatus provided in examples of this disclosure, hydrophobic particles is blended into the organic layer. Thereby, the blocking ability against moisture and oxygen of the organic layer may be greatly improved, and the moisture, oxygen and the like entering the encapsulation structure from environment by penetration may be reduced effectively, so that the encapsulation effect is improved and the life time of the display device is extended. Concerning the detailed description of the encapsulation structure, the method for producing the same and the display apparatus, which are provided in examples of this disclosure, please refer to the examples below.

Figure 2:
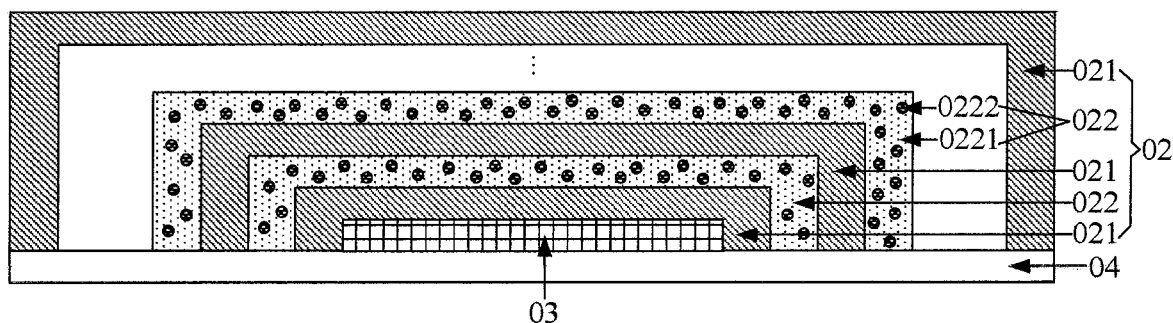
FIG. 2 is a drawing showing the use of an encapsulation structure provided in an example of this disclosure.

Referring to FIG. 2, it shows the use of an encapsulation structure 02 provided in an example of this disclosure. Referring to FIG. 2, the encapsulation structure 02 comprises a plurality of layers covering the outside of a device to be encapsulated 03, wherein the plurality of layers comprises an inorganic layer 021 and an organic layer 022 which are stacked alternatively, wherein the organic layer 022 comprises an organic layer matrix 0221 and hydrophobic particles 0222.

In this disclosure, the encapsulation structure comprises at least one inorganic layer and one organic layer stacked alternatively. Optionally, the encapsulation structure comprises one inorganic layer, one organic layer and another inorganic layer which are stacked alternatively, as shown in FIG. 2. The inorganic layers on both sides of the organic layer provide better ability to block moisture and oxygen. The encapsulation structure may comprise more inorganic layers and organic layers which are stacked alternatively. Here, the respective inorganic layers may be the same or different, and the respective organic layers may also be the same or different.

Figure 4:
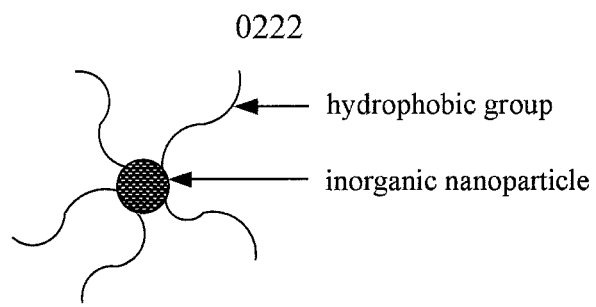
FIG. 4 is a structural schematic drawing of a hydrophobic particle provided in an example of this disclosure.

Referring to FIG. 4, it shows a structural schematic drawing of a hydrophobic particle 0222 provided in an example of this disclosure. Referring to FIG. 4, the hydrophobic particle 0222 comprises an inorganic nanoparticle and a hydrophobic group. The hydrophobic particle 0222 may have a core-shell structure. The inorganic nanoparticle serves as a core, while the shell comprises the hydrophobic group. The shell may be formed by a material comprising the hydrophobic group. The term "shell" here refers to a material which surrounds the inorganic nanoparticle core, but it is not necessary to cover the core fully by the shell. The hydrophobic particle 0222 may be formed by chemical reaction between an inorganic nanoparticle and a material comprising the hydrophobic group. For example, the hydrophobic group and the inorganic nanoparticle form the hydrophobic particle 0222 by chemical binding. The inorganic nanoparticle may include at least one of a silica ($SiO_2$) particle, a magnesium oxide (MgO) particle, a magnesium fluoride ($MgF_2$) particle, a titanium oxide ($TiO_2$) particle, a zinc oxide (ZnO) particle, a zinc sulfide (ZnS) particle, an alumina ($Al_2O_3$) particle, and a zirconia ($ZrO_2$) particle. The hydrophobic group may comprise at least one of alkyl, aryl, and arylalkyl. As an example, the hydrophobic particle may be formed by combining an inorganic nanoparticle with a fatty acid or sulfonic acid, wherein the fatty acid or sulfonic acid comprises an alkyl, aryl, or arylalkyl group as the hydrophobic group. Examples of the fatty acid or sulfonic acid comprising an alkyl, aryl, or arylalkyl group include stearic acid, octadecyl sulfonic acid, and the like. The stearic acid, octadecyl sulfonic acid, or the like is bonded with the inorganic nanoparticle, to form a shell surrounding the inorganic nanoparticle core, wherein the shell comprises a hydrophobic group. A specific bonding method is mixing the fatty acid or sulfonic acid with alkaline metal hydroxide, and then allowing the mixture reacting with the inorganic nanoparticles. It should be noticed that since the hydrophobic particle 0222 comprises an inorganic nanoparticle and a hydrophobic group, the hydrophobic particle 0222 has not only the property of an inorganic material, but also the property of an organic material. This allows the obtained organic layer 022 has the moisture-blocking property of an inorganic layer, and further allows the hydrophobic layer 023 has the moisture-blocking property of an inorganic layer and the bendability of an organic layer, so that flexible displaying may be achieved more easily. In examples of this disclosure, the moisture and oxygen permeation rate of the hydrophobic particle 0222 may be less than $10^{-6}$ g/m$^2$/day.

To sum up, in the encapsulation structure provided in the example of this disclosure, since the organic layer comprises hydrophobic particles, which have the ability to block moisture and oxygen, the organic layer per se has the ability to block moisture and oxygen. Therefore, if an air channel is formed in the inorganic layer, when moisture or oxygen arrives at the organic layer via the air channel, the organic layer would block the moisture and oxygen. This may solve the problem that the encapsulation effect of the encapsulation structure is relatively poor, which is beneficial to improve the encapsulation effect. The hydrophobic particles formed by the reaction between the inorganic nanoparticle and the material comprising the hydrophobic group provided in examples of this disclosure have excellent compatibility to the organic layer. The mechanic property and the ability to block moisture and oxygen of organic layer formed are greatly increased, as compared with an organic layer doped with large-particle inorganic particles. Further, the nanoparticle has a relatively small volume, which may avoid reflection and refraction of light on large particles, and thereby avoiding the reflection and refraction of light on the organic layer 022 and the hydrophobic layer 023, so as to ensure the light-transmitting property of the encapsulation structure 02.

Figure 3:
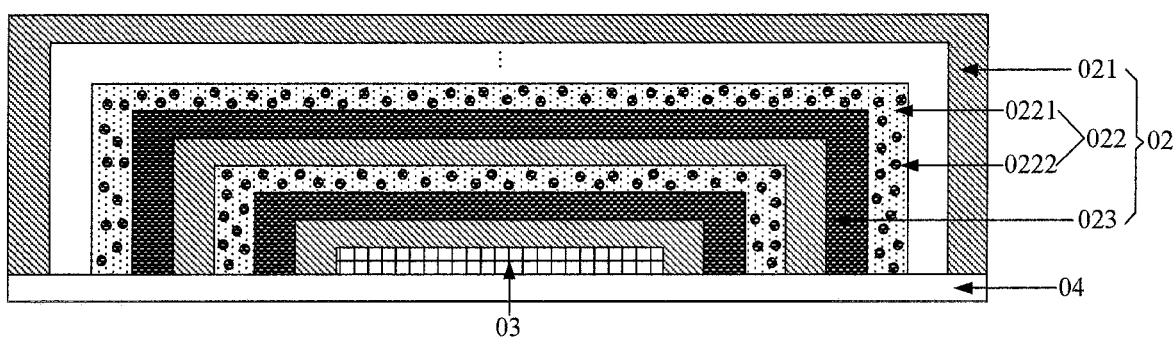
FIG. 3 is a drawing showing the use of another encapsulation structure provided in an example of this disclosure.

Further, referring to FIG. 3, it shows the use of another encapsulation structure 02 provided in an example of this disclosure. Referring to FIG. 3, on the basis of FIG. 2, the encapsulation structure 02 further comprises a hydrophobic layer 023 between the inorganic layer 021 and the organic layer 022, wherein the elasticity of the hydrophobic layer 023 is larger than that of the inorganic layer 021. In an example of this disclosure, the material forming the hydrophobic layer 023 includes a hydrophobic particle. The hydrophobic particle forming the hydrophobic layer 023 may be the same as the hydrophobic particle 0222 in the organic layer 022. In an example of this disclosure, the hydrophobic layer 023 is provided between the inorganic layer 021 and the organic layer 022. Since the hydrophobic layer 023 has the ability to block moisture and oxygen, the encapsulation effect of the encapsulation structure 02 is further increased. For clarity, layers of the same type are not all indicated by number in the drawings, while they are represented by the same pattern. Therefore, for example, in FIG. 3, the layer next to the device to be encapsulated 03 is also an inorganic layer.

Optionally, the material forming the hydrophobic particle 0222 includes a material having a wide band gap, and the transparency of the hydrophobic particle 0222 is more than 0.9. Here, the material having a wide band gap is a material having a band gap of more than 4 eV (electron volt). A material having a wide band gap absorbs less light. Therefore, the absorption of light by the hydrophobic particle 0222 may be avoided by forming the hydrophobic particle 0222 with the material having a wide band gap. The transparency of the hydrophobic particle 0222 of more than 0.9 results in that the hydrophobic particle 0222 has a relatively high transparency, so as to avoid the block of light by the hydrophobic particle 0222. In an example of this disclosure, the hydrophobic particle 0222 is formed of a material having a wide band gap, and the transparency of the hydrophobic particle 0222 is more than 0.9, which may ensure the light-transmitting property of the encapsulation structure 02.

Optionally, the material forming the organic layer matrix 0221 may include any of a UV-curable material and a thermal-curable material. The UV-curable material may be, for example, a polyacrylate-based material. The material forming the inorganic layer 021 may include at least one of silica ($SiO_2$), silicon nitride ($SiN_x$) and silicon oxynitride ($SiON_x$). Further, in the multiple inorganic layers 021 in the encapsulation structure 02, the materials forming any two of the inorganic layers 021 may be the same or different, which are not limited in examples of this disclosure.

Figure 5:
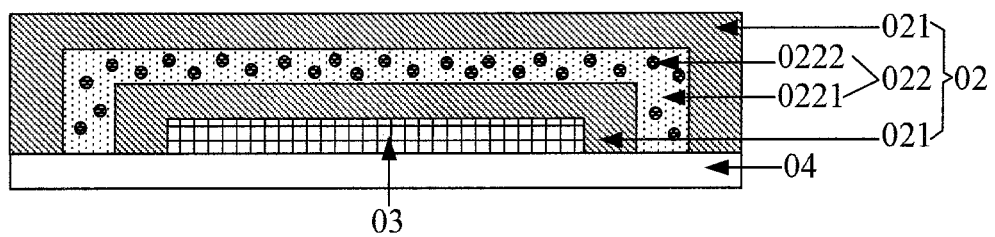
FIG. 5 is a drawing showing the use of still another encapsulation structure provided in an example of this disclosure.
Figure 6:
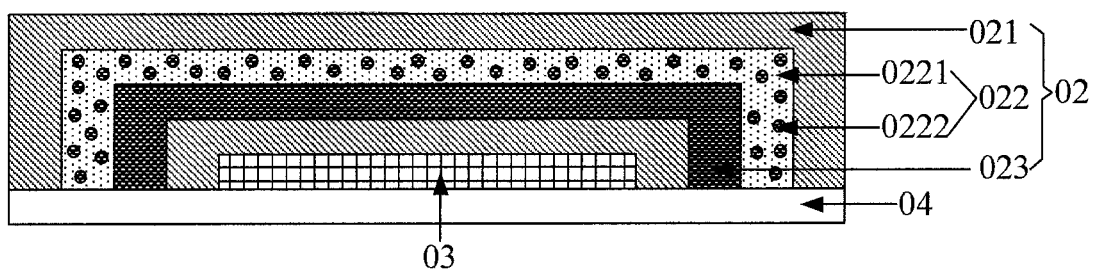
FIG. 6 is a drawing showing the use of further another encapsulation structure provided in an example of this disclosure.

Optionally, as shown in FIG. 5, a plurality of layers are 3 layers stacked alternatively, or as shown in FIG. 6, a plurality of layers are 4 layers stacked alternatively, wherein in the plurality of layers, both of the layer next to the device to be encapsulated 03 and the layer furthest from the device to be encapsulated 03 are inorganic layers 021. It should be noticed that FIG. 3 and FIG. 6 are merely illustrative. In practice, the hydrophobic layer 023 may be provided between any adjacent inorganic layer 021 and organic layer 022, which is not limited in examples of this disclosure. It should also be noticed that the hydrophobic particles 0222 are depicted exemplarily in FIGS. 2-3 and 5-6 for convenience of viewing. In practice, since nanoparticles cannot be distinguished by naked eyes, hydrophobic particles 0222 cannot be seen directly.

Optionally, in an example of this disclosure, the device to be encapsulated 03 may be an OLED device or a quantum dot light emitting diode (QLED) device. As shown in FIGS. 2-3 and 5-6, the device to be encapsulated 03 is on the base substrate 04. Specifically, it may be on the display zone in the base substrate 04, wherein each of the inorganic layer 021 and organic layer 022 covers the display zone of the base substrate 04. Optionally, the base substrate 04 may be a transparent substrate, specifically, it may be a substrate made of a transparent non-metal material having soundness, such as glass, quartz, and transparent resins. Typically, a flexible base may be provided on the base substrate 04. After the encapsulation structure 02 is formed, the base substrate 04 may be peeled off, so that flexible displaying is achieved by the flexible base. Or, the base substrate 04 per se may be a flexible substrate, so that flexible displaying is achieved directly by using the base substrate 04. Here, the flexible base or flexible substrate may be formed of polyimide (PI). The inorganic layer 021 may be formed by a process, such as chemical vapor deposition, evaporation, sputtering, or the like. The organic layer 022 and the hydrophobic layer 023 may be formed by an applying process, such as an ink jet printing process, a spin coating process, a screen printing process, a transfer printing, or the like.

To sum up, in the encapsulation structure provided in the example of this disclosure, since the organic layer comprises hydrophobic particles, which have the ability to block moisture and oxygen, the organic layer per se has the ability to block moisture and oxygen. Therefore, if an air channel is formed in the inorganic layer, when moisture or oxygen arrives at the organic layer via the air channel, the organic layer would block the moisture and oxygen. This may solve the problem that the encapsulation effect of the encapsulation structure is relatively poor, which is beneficial to improve the encapsulation effect. The hydrophobic particles formed by the reaction between the inorganic nanoparticle and the material comprising the hydrophobic group provided in examples of this disclosure have excellent compatibility to the organic layer. The mechanic property and the ability to block moisture and oxygen of organic layer formed are greatly increased, as compared with an organic layer doped with large-particle inorganic particles. Further, the nanoparticle has a relatively small volume, which may avoid reflection and refraction of light on large particles, and thereby avoiding the reflection and refraction of light on the organic layer and the hydrophobic layer, so as to ensure the light-transmitting property of the encapsulation structure 02.

The encapsulation structure provided in examples of this disclosure may be used in the method described below. The production method and production principle of the encapsulation structure in examples of this disclosure may refer to the examples below.

Figure 7:
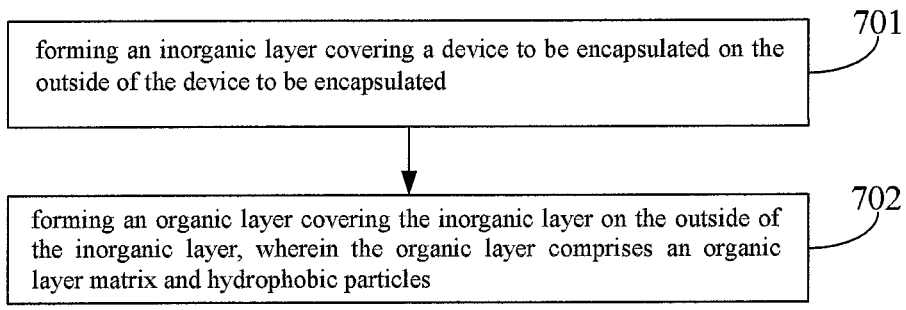
FIG. 7 is a flow chart of a method for producing an encapsulation structure provided in an example of this disclosure.

Referring to FIG. 7, it shows a flow chart of a method for producing an encapsulation structure provided in an example of this disclosure. The production method of the encapsulation structure may be used to produce the encapsulation structure 02 shown in any of FIGS. 2-3 and 5-6. Referring to FIG. 7, the method comprises:

Step 701, forming an inorganic layer covering a device to be encapsulated on the outside of the device to be encapsulated; and Step 702, forming an organic layer covering the inorganic layer on the outside of the inorganic layer, wherein the organic layer comprises an organic layer matrix and hydrophobic particles.

To sum up, in the production method of the encapsulation structure provided in the example of this disclosure, since the organic layer comprises hydrophobic particles, which have the ability to block moisture and oxygen, the organic layer per se has the ability to block moisture and oxygen. Therefore, if an air channel is formed in the inorganic layer, when moisture or oxygen arrives at the organic layer via the air channel, the organic layer would block the moisture and oxygen. This may solve the problem that the encapsulation effect of the encapsulation structure is relatively poor, which is beneficial to improve the encapsulation effect.

Optionally, the above-mentioned Step 702 comprises:

forming a hydrophobic layer covering the inorganic layer on the outside of the inorganic layer, wherein the elasticity of the hydrophobic layer is larger than that of the inorganic layer; and forming the organic layer on the outside of the hydrophobic layer, to cover the hydrophobic layer, wherein the organic layer comprises an organic layer matrix and hydrophobic particles.

Optionally, said forming a hydrophobic layer covering the inorganic layer on the outside of the inorganic layer comprising forming a hydrophobic layer covering the inorganic layer on the outside of the inorganic layer by an applying process by using the hydrophobic particles.

Here, the applying process includes an ink jet printing process or a spin coating process.

Optionally, the above-mentioned Step 702 comprises:

forming a mixture layer of an organic material and hydrophobic particles on the outside of the inorganic layer by an applying process; and subjecting the mixture layer to curing treatment, to obtain the organic layer, wherein the organic material comprises any of a UV-curable material and a thermal-curable material, and the applying process includes an ink jet printing process or a spin coating process.

All optional technical solutions mentioned above may be arbitrarily combined to form examples of this disclosure, which are not further described in details one by one.

To sum up, in the production method of the encapsulation structure provided in the example of this disclosure, since the organic layer comprises hydrophobic particles, which have the ability to block moisture and oxygen, the organic layer per se has the ability to block moisture and oxygen. Therefore, if an air channel is formed in the inorganic layer, when moisture or oxygen arrives at the organic layer via the air channel, the organic layer would block the moisture and oxygen. This may solve the problem that the encapsulation effect of the encapsulation structure is relatively poor, which is beneficial to improve the encapsulation effect.

Figure 8:
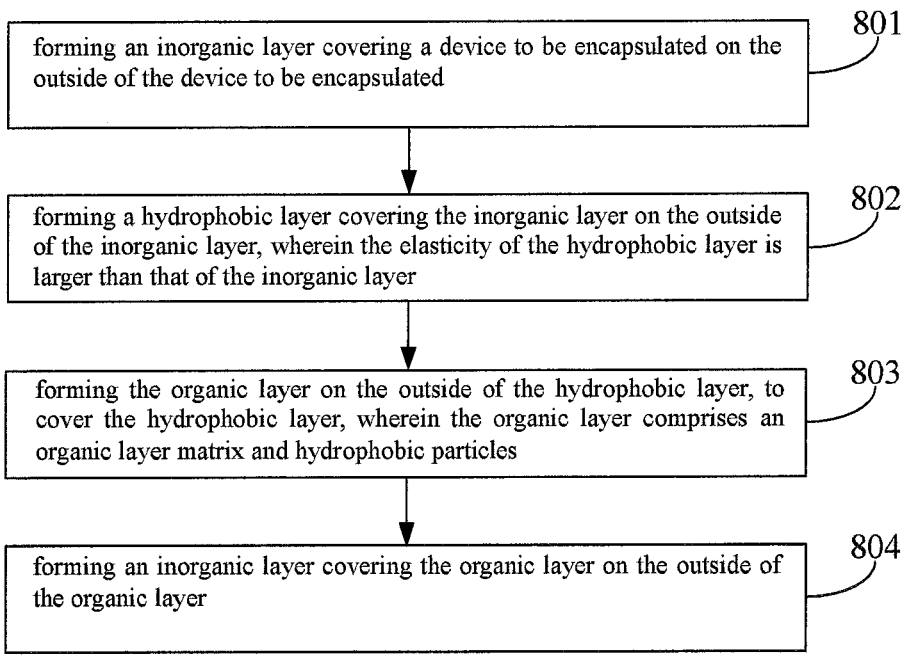
FIG. 8 is a flow chart of another method for producing an encapsulation structure provided in an example of this disclosure.

Referring to FIG. 8, it shows a flow chart of another method for producing an encapsulation structure provided in an example of this disclosure. The production method of the encapsulation structure may be used to produce the encapsulation structure 02 shown in any of FIGS. 3 and 6. Production of the encapsulation structure 02 shown in FIG. 6 will be taken as the example below for illustration. Referring to FIG. 8, the method comprises the following steps.

Step 801: forming an inorganic layer covering a device to be encapsulated on the outside of the device to be encapsulated.

As shown in FIG. 6, the device to be encapsulated 03 is on the base substrate 04. Thus, forming an inorganic layer 021 covering a device to be encapsulated 03 on the outside of the device to be encapsulated 03 is forming the inorganic layer 021 on the base substrate 04 of the device to be encapsulated 03. The inorganic layer 021 covers the outside of the device to be encapsulated 03.

Figure 9:
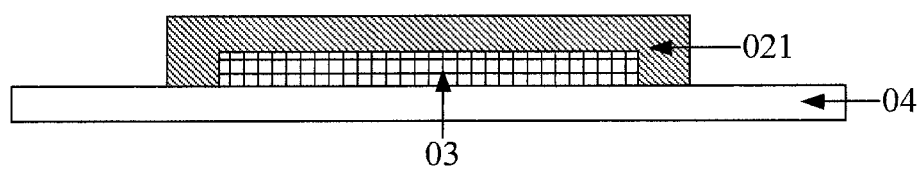
FIG. 9 is a schematic drawing of a structure after an inorganic layer is formed on the outside of the device to be encapsulated provided in an example of this disclosure.

Referring to FIG. 9, it shows a schematic drawing of a structure after an inorganic layer 021 is formed on the base substrate 04 of the device to be encapsulated 03 provided in an example of this disclosure. Referring to FIG. 9, the inorganic layer 021 covers the outside of the device to be encapsulated 03. The inorganic layer 021 may be formed of any of $SiO_2$, $SiN_x$ and $SiON_x$, by a process, such as chemical vapor deposition, evaporation, sputtering, or the like. Optionally, a chemical vapor deposition process may be used to deposit a layer of $SiN_x$ on the base substrate 04 having the device to be encapsulated 03 thereon, to form a $SiN_x$ layer. Then the $SiN_x$ layer is treated by a single patterning process to obtain the inorganic layer 021. Here, the single patterning process comprises applying a photoresist, exposing, developing, etching, and peeling off the photoresist. Thus, treating the $SiN_x$ layer by a single patterning process to obtain the inorganic layer 021 comprises: applying a layer of photoresist on the $SiN_x$ layer to obtain a photoresist layer; then exposing the photoresist with a mask, to form a fully exposed area and an unexposed area in the photoresist layer; then treating the exposed photoresist layer by a development process, to remove the photoresist in the fully exposed area and retain the photoresist in the unexposed area; then etching the zone in the $SiN_x$ layer corresponding to the fully exposed area; and at last peeling off the photoresist in the unexposed area, so that the inorganic layer 021 is formed in the zone in the $SiN_x$ layer corresponding to the unexposed area. It should be noticed that in this example of this disclosure, formation of the inorganic layer 021 by a positive photoresist is taken as the example for illustration. In practice, the inorganic layer 021 may also be formed by using a negative photoresist. It is not limited in examples of this disclosure.

Step 802: forming a hydrophobic layer covering the inorganic layer on the outside of the inorganic layer, wherein the elasticity of the hydrophobic layer is larger than that of the inorganic layer.

Figure 10:
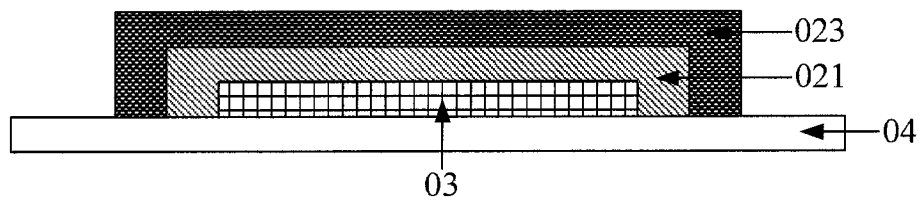
FIG. 10 is a schematic drawing of a structure after a hydrophobic layer is formed on the outside of the inorganic layer provided in an example of this disclosure.

Referring to FIG. 10, it shows a schematic drawing of a structure after a hydrophobic layer 023 covering the inorganic layer 021 is formed on the outside of the inorganic layer 021 provided in an example of this disclosure. Referring to FIG. 10, the hydrophobic layer 023 covers the outside of the inorganic layer 021. The hydrophobic layer 023 may be formed of a hydrophobic material by an applying process. The applying process may include an ink jet printing process, a spin coating process, a screen printing process, a transfer printing, or the like. The hydrophobic material includes the hydrophobic particle. The hydrophobic particle may be nanoparticles, and the material form the hydrophobic particle includes a material having a wide band gap and having a transparency of more than 0.9. The hydrophobic particle comprises an inorganic nanoparticle and a hydrophobic group, for example, a core of the inorganic nanoparticle and a shell comprising the hydrophobic group. In particular, the hydrophobic particle may be formed by a chemical reaction between the inorganic nanoparticle and a material comprising the hydrophobic group. The inorganic nanoparticle may include at least one of a $SiO_2$ particle, a MgO particle, a $MgF_2$ particle, a $TiO_2$ particle, a ZnO particle, a ZnS particle, an $Al_2O_3$ particle, and a $ZrO_2$ particle. The hydrophobic group may comprise at least one of alkyl, aryl, and arylalkyl.

Optionally, the hydrophobic layer 023 covering the inorganic layer may be formed on the outside of the inorganic layer 021 by an applying process with a hydrophobic material. Exemplarily, a layer of hydrophobic material is deposited on the base substrate 04 having the inorganic layer 021 thereon by an ink jet process, to form a hydrophobic material layer. Then the hydrophobic material layer is dried, to remove the moisture in the hydrophobic material layer. At last, the hydrophobic material layer is treated by a single patterning process to obtain the hydrophobic layer 023. Here, the single patterning process comprises applying a photoresist, exposing, developing, etching, and peeling off the photoresist. Thus, treating the hydrophobic material layer by a single patterning process to obtain the hydrophobic layer 023 comprises: applying a layer of photoresist on the hydrophobic material layer to obtain a photoresist layer; then exposing the photoresist with a mask, to form a fully exposed area and an unexposed area in the photoresist layer; then treating the exposed photoresist layer by a development process, to remove the photoresist in the fully exposed area and retain the photoresist in the unexposed area; then etching the zone in the hydrophobic material layer corresponding to the fully exposed area; and at last peeling off the photoresist in the unexposed area, so that the hydrophobic layer 023 is formed in the zone in the hydrophobic material layer corresponding to the unexposed area. It should be noticed that in this example of this disclosure, formation of the hydrophobic layer 023 by a positive photoresist is taken as the example for illustration. In practice, the hydrophobic layer 023 may also be formed by using a negative photoresist. It is not limited in examples of this disclosure.

Step 803: forming the organic layer on the outside of the hydrophobic layer, to cover the hydrophobic layer, wherein the organic layer comprises an organic layer matrix and hydrophobic particles.

Figure 11:
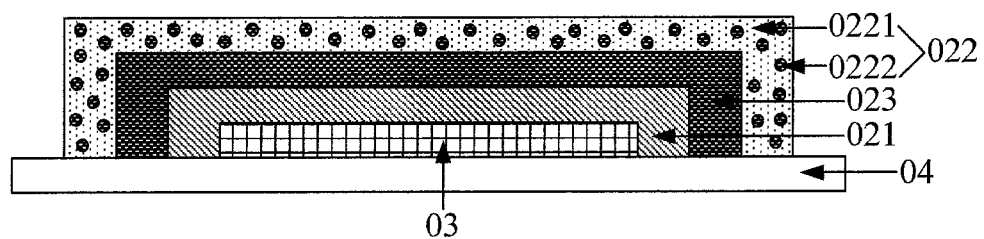
FIG. 11 is a schematic drawing of a structure after an organic layer is formed on the outside of the hydrophobic layer provided in an example of this disclosure.

Referring to FIG. 11, it shows a schematic drawing of a structure after an organic layer 022 covering the hydrophobic layer 023 is formed on the outside of the hydrophobic layer 023 provided in an example of this disclosure. Referring to FIG. 11, the organic layer 022 covers the outside of the hydrophobic layer 023, and the organic layer 022 comprises the organic layer matrix 0221 and the hydrophobic particle 0222. Here, the material forming the organic layer matrix 0221 is an organic material, which may specifically be any one of a UV-curable material and a thermal-curable material. The hydrophobic particle 0222 may be nanoparticles, and the material form the hydrophobic particle 0222 includes a material having a wide band gap and having a transparency of more than 0.9. The hydrophobic particle 0222 comprises an inorganic nanoparticle and a hydrophobic group, for example, a core of the inorganic nanoparticle and a shell comprising the hydrophobic group. In particular, the hydrophobic particle may be formed by a chemical reaction between the inorganic nanoparticle and a material comprising the hydrophobic group. The inorganic nanoparticle may include at least one of a $SiO_2$ particle, a MgO particle, a $MgF_2$ particle, a $TiO_2$ particle, a ZnO particle, a ZnS particle, an $Al_2O_3$ particle, and a $ZrO_2$ particle. The hydrophobic group may comprise at least one of alkyl, aryl, and arylalkyl. In an example of this disclosure, the hydrophobic particle 0222 may be mixed with the organic material, so that the hydrophobic particle 0222 dispersed in the organic material uniformly, to obtain a mixture, which is then used to form the organic layer 022 by an applying process.

Optionally, the organic layer 022 may be obtained by using the mixture to form a mixture layer on the outside of the hydrophobic layer 023 by an applying process and then subjecting the mixture layer to a curing treatment. Here, the applying process includes an ink jet process or a spin coating process. Exemplarily, when the organic material forming the organic layer matrix 0221 is a UV-curable material, the organic layer 022 may be obtained by the following steps: using the mixture to form a mixture layer on the outside of the hydrophobic layer 023 by an ink jet process; irradiating the mixture layer with UV-light to allow the mixture layer curing; then treating the cured mixture layer by a single patterning process.

Step 804: forming an inorganic layer covering the organic layer on the outside of the organic layer.

Here, the structure after the inorganic layer 021 covering the organic layer 022 is formed on the outside of the organic layer 022 may refer to FIG. 6. The specific process for carrying out the Step 804 may refer to the above-mentioned Step 801. The details thereof are not described in this example again.

To sum up, in the production method of the encapsulation structure provided in the example of this disclosure, since the organic layer comprises hydrophobic particles, which have the ability to block moisture and oxygen, the organic layer per se has the ability to block moisture and oxygen. Therefore, if an air channel is formed in the inorganic layer, when moisture or oxygen arrives at the organic layer via the air channel, the organic layer would block the moisture and oxygen. This may solve the problem that the encapsulation effect of the encapsulation structure is relatively poor, which is beneficial to improve the encapsulation effect.

An example of this disclosure also provides a display apparatus, comprising a display device encapsulated by an encapsulation structure. The display device may be an OLED device or a QLED. The encapsulation structure may be the above-mentioned encapsulation structure, for example, the encapsulation structure 02 shown in any of FIGS. 2-3 and 5-6. Here, the display device may be located on a base substrate, which may be a rigid substrate (e.g. a glass substrate) or a flexible substrate.

To sum up, in the display apparatus provided in the example of this disclosure, since the organic layer comprises hydrophobic particles, which have the ability to block moisture and oxygen, the organic layer per se has the ability to block moisture and oxygen. Therefore, if an air channel is formed in the inorganic layer, when moisture or oxygen arrives at the organic layer via the air channel, the organic layer would block the moisture and oxygen. This may solve the problem that the encapsulation effect of the encapsulation structure is relatively poor, which is beneficial to improve the encapsulation effect, so that the life time of the display device is extended and thus the life time of the display apparatus is extended.

An Example: Production of a Hydrophobic Particle

A hydrophobic particle was produced by the following steps.

(1) 20 g of $SiO_2$ nanoparticles were weighed and added into a three-necked flask. 100 ml water was added thereto, to form a dispersion.

(2) The flask was placed in a water-bath pot at a constant temperature of 80° C., with continuous stirring at an appropriate speed throughout the experiment.

(3) Potassium hydroxide was dissolved in an appropriate amount of water. After the potassium hydroxide was completely dissolved, an appropriate amount of stearic acid (octadecanoic acid) was added into the potassium hydroxide solution. The heating of the mixture was continued, to continue the dissolution. The heated mixture was added to the three-necked flask.

(4) The stirring was continued for one hour. Vacuum suction strainer was performed by using a Buchner funnel when the mixture was still hot. The product was transferred to a clean crucible. The crucible was placed in an oven at 110° C., until the content was dried. The dried product was ground into powders, which are collected for use.

The collected powders could be used as hydrophobic particles.

An Example: Production of Another Hydrophobic Particle

Another hydrophobic particle was produced by the following steps.

(1) 20 g of ZnO nanoparticles were weighed and added into a three-necked flask. 80 ml water was added thereto, to form a dispersion.

(2) The flask was placed in a water-bath pot at a constant temperature of 80° C., with continuous stirring at an appropriate speed throughout the experiment.

(3) Sodium hydroxide was dissolved in an appropriate amount of water. After the sodium hydroxide was completely dissolved, an appropriate amount of octadecyl sulfonic acid was added into the sodium hydroxide solution. The heating of the mixture was continued, to continue the dissolution. The heated mixture was added to the three-necked flask.

(4) The stirring was continued for one hour. Vacuum suction strainer was performed by using a Buchner funnel when the mixture was still hot. The product was transferred to a clean crucible. The crucible was placed in an oven at 110° C., until the content was dried. The dried product was ground into powders, which are collected for use.

The collected powders could be used as hydrophobic particles.

A person skilled in the art may understand that all steps or a part of steps for performing the above-mentioned examples may be carried out by hardware, or carried out by a program that instructs associated hardware. The program may be store in a computer-readable storage medium, which may be a read-only storage, a magnetic disk or a CD.

The examples above are only preferred examples of this disclosure and do not intend to limit this disclosure. Any change, equivalent replacement, modification, and the like with in the spirit and concept of this disclosure are involved in the protection scope of this disclosure.

The invention claimed is:

1. An encapsulation structure, comprising a plurality of layers covering the outside of a device to be encapsulated, wherein the plurality of layers comprises an inorganic layer and an organic layer, which are stacked alternatively, wherein the organic layer comprises an organic layer matrix and hydrophobic particles dispersed in the organic layer matrix, and wherein constituents of the hydrophobic particle comprises:
an inorganic nanoparticle,
and a hydrophobic group bonded to the inorganic nanoparticle.

2. The encapsulation structure according to claim 1, wherein the hydrophobic particle comprises a core of the inorganic nanoparticle and a shell comprising the hydrophobic group.

3. The encapsulation structure according to claim 1, wherein the plurality of layers comprises an inorganic layer, an organic layer and an inorganic layer, which are stacked alternatively.

4. The encapsulation structure according to claim 1, wherein the hydrophobic group comprises at least one of alkyl, aryl, and arylalkyl.

5. The encapsulation structure according to claim 1, wherein the inorganic nanoparticle includes at least one of a silica particle, a magnesium oxide particle, a magnesium fluoride particle, a titanium oxide particle, a zinc oxide particle, a zinc sulfide particle, an alumina particle, and a zirconia particle.

6. The encapsulation structure according to claim 1, further comprising a hydrophobic layer between the inorganic layer and the organic layer, wherein the elasticity of the hydrophobic layer is larger than that of the inorganic layer.

7. The encapsulation structure according to claim 6, wherein the hydrophobic layer is formed of the hydrophobic particles.

8. The encapsulation structure according to claim 1, wherein the hydrophobic particle is formed of a material having a wide band gap, and the transparency of the hydrophobic particle is more than 0.9.

9. The encapsulation structure according to claim 1, wherein the organic layer matrix is formed of a material selected from the group consisting of a UV-curable material and a thermal-curable material.

10. The encapsulation structure according to claim 1, wherein the inorganic layer is formed of at least one material selected from silica, silicon nitride and silicon oxynitride.

11. A method for producing the encapsulation structure according to claim 1, comprising:
forming an inorganic layer covering a device to be encapsulated on the outside of the device to be encapsulated; and forming an organic layer covering the inorganic layer on the outside of the inorganic layer, wherein the organic layer comprises an organic layer matrix and hydrophobic particles, wherein the hydrophobic particle comprises an inorganic nanoparticle and a hydrophobic group.

12. The method according to claim 11, wherein the hydrophobic particle comprises a core of the inorganic nanoparticle and a shell comprising the hydrophobic group.

13. The method according to claim 11, wherein the hydrophobic group comprises at least one of alkyl, aryl, and arylalkyl.

14. The method according to claim 11, wherein the inorganic nanoparticle includes at least one of a silica particle, a magnesium oxide particle, a magnesium fluoride particle, a titanium oxide particle, a zinc oxide particle, a zinc sulfide particle, an alumina particle, and a zirconia particle.

15. The method according to claim 11, wherein said forming an organic layer covering the inorganic layer on the outside of the inorganic layer comprises:
forming a hydrophobic layer covering the inorganic layer on the outside of the inorganic layer, wherein the elasticity of the hydrophobic layer is larger than that of the inorganic layer; and
forming the organic layer on the outside of the hydrophobic layer, to cover the hydrophobic layer.

16. The method according to claim 15, wherein said forming a hydrophobic layer covering the inorganic layer on the outside of the inorganic layer comprises:
forming a hydrophobic layer covering the inorganic layer on the outside of the inorganic layer by an ink jet printing process or a spin coating process by using the hydrophobic particles.

17. The method according to claim 11, wherein said forming an organic layer covering the inorganic layer on the outside of the inorganic layer comprises:
forming a mixture layer of an organic material and hydrophobic particles on the outside of the inorganic layer by an ink jet printing process or a spin coating process; and
subjecting the mixture layer to curing treatment, to obtain the organic layer,
wherein the organic material comprises any of a UV-curable material and a thermal-curable material.

18. A display apparatus, comprising:
a display device encapsulated by the encapsulation structure according to claim 1.

19. The display apparatus according to claim 18, wherein the display device is an organic light-emitting diode device or a quantum dot light-emitting diode device.

* * * * *